United States Patent [19]
Schulmann

[11] Patent Number: 5,935,329
[45] Date of Patent: Aug. 10, 1999

[54] LIFTING UNIT FOR A MONOCRYSTAL PULLER

[75] Inventor: Winfried Schulmann, Kleinostheim, Germany

[73] Assignee: Leybold Systems GmbH, Hanau, Germany

[21] Appl. No.: 09/041,680

[22] Filed: Mar. 13, 1998

[30] Foreign Application Priority Data

Mar. 15, 1997 [DE] Germany .......................... 197 10 856

[51] Int. Cl.$^6$ ................................................. C30B 35/00
[52] U.S. Cl. .......................... 117/218; 117/208; 117/911
[58] Field of Search .............................. 117/14, 15, 200, 117/208, 218, 911

[56] References Cited

U.S. PATENT DOCUMENTS

| | | | |
|---|---|---|---|
| 4,190,630 | 2/1980 | Apilat et al. | 117/217 |
| 5,196,086 | 3/1993 | Kidajetah | 117/35 |

FOREIGN PATENT DOCUMENTS 0 449 260 A2  10/1991  European Pat. Off. .
0 498 652 A1  8/1992  European Pat. Off. .

*Primary Examiner*—Felisa Hiteshew
*Attorney, Agent, or Firm*—Smith, Gambrell & Russell; Beveridge, DeGrandi, Weilacher & Intellectual Property Group

[57] ABSTRACT

In a lifting unit for a device for pulling monocrystals, a frame that extends in the horizontal direction and surrounds a pulling shaft and/or a crystal is provided with at least two bearings as well as two-armed grippers that are held in the aforementioned bearings and can be pivoted in vertical planes. The respective gripping arms are aligned with the rotational axis of the frame and have such a length that the end surfaces of the gripping arms which face one another tightly adjoin one another in the closed position and only allow a limited pivoting movement. The respective free ends of the two-armed grippers are coupled to tie rods that approximately extend in the vertical direction. The upper ends of the tie rods are connected in articulated fashion via a horizontally extending crossbeam, where the crossbeam with a spindle nut can be adjusted along the pulling shaft via a threaded spindle. The frame is suspended on cables that serve for pivoting the gripping arms.

20 Claims, 3 Drawing Sheets

LIFTING UNIT FOR A MONOCRYSTAL PULLER

INTRODUCTION AND BACKGROUND

The present invention pertains to a lifting unit for a device for pulling monocrystals from a molten mass located in a crucible vacuum or a protective gas at reduced pressure, wherein the crucible is arranged in a vacuum chamber that is supported on a main frame and heated by the thermal radiation of a heating element, wherein a pulling shaft that makes it possible to pull the crystal up from the surface of the molten mass into a lock chamber that can be displaced relative to the main frame is provided above the molten mass, and wherein the lifting unit is held by the housing of the lock chamber, a top frame supported on the main frame or the pulling shaft.

The crystal suspended on the seedling inside the lock chamber is usually taken hold of by a special handling system that extends through a lateral opening of the lock chamber, whereafter the crystal is severed from the seedling and laterally removed from the lock chamber through the opening that can be closed by a shutter with the aid of the handling system.

This known method has a number of disadvantages, all of which result from the particular sensitivity of the crystal to shocks and vibrations. In addition, the crystal may not be properly taken hold of by the handling system because the crystal is not freely accessible while suspended in the lock chamber.

In another known device, the lock chamber is pivoted on the frame of the device together with the bulky and heavy pulling shaft and the shaft drive after the pulling process and after the ventilation of the lock chamber. In this case, the crystal can be lowered onto a transport cart that is moved underneath the lock chamber or transferred to such a transport cart. However, various devices of this type have the decisive disadvantage that the position of the individual components relative to one another cannot be ensured during the continuous operation of the system due to the size of the pulling device and the weight of its individual components. It is, in particular, very difficult to maneuver the sensitive and highly precise pulling shaft back into its proper angular position above the molten mass together with its drive.

SUMMARY OF THE INVENTION

An object of the present invention is to develop a device of the above mentioned type in such a way that the crystal is able safely to grow in the lock chamber without being subjected to shocks, and that the finished crystal can be removed and transported away, without having to move sensitive components of the device out of their operating position or retrofitting the lock chamber.

The above and other obejcts of the present invention are achieved with a frame that extends in a horizontal plane and surrounds the pulling shaft and/or the crystal, wherein said frame comprises at least two bearings and two-armed grippers that are held in the aforementioned bearings and can be pivoted in vertical planes, wherein one respective gripping arm of the two-armed grippers is aligned with the rotational axis of the frame and has such longitudinal dimensions that the end faces of the gripping arms which face one another tightly adjoin one another in the closed position, such that an additional pivoting movement is prevented, wherein the free ends of the respective two-armed grippers are coupled to tie rods that extend approximately vertically, wherein the respective upper ends of said tie rods are connected to one another in articulated fashion via a horizontally extending crossbeam, wherein the crossbeam that is provided with a spindle nut can be adjusted along the pulling shaft via a threaded spindle, and wherein the frame is suspended on cables that can be locked in a holding device or wound onto a pulley lifting tackle which is held on the cover of the lock chamber or above the lock chamber on the main frame.

BRIEF DESCRIPTION OF DRAWINGS

The invention will be further understood with reference to one of several embodiments illustrated in schematic fashion in the accompanying figures, wherein.

DETAILED DESCRIPTION OF INVENTION

Figure 3:
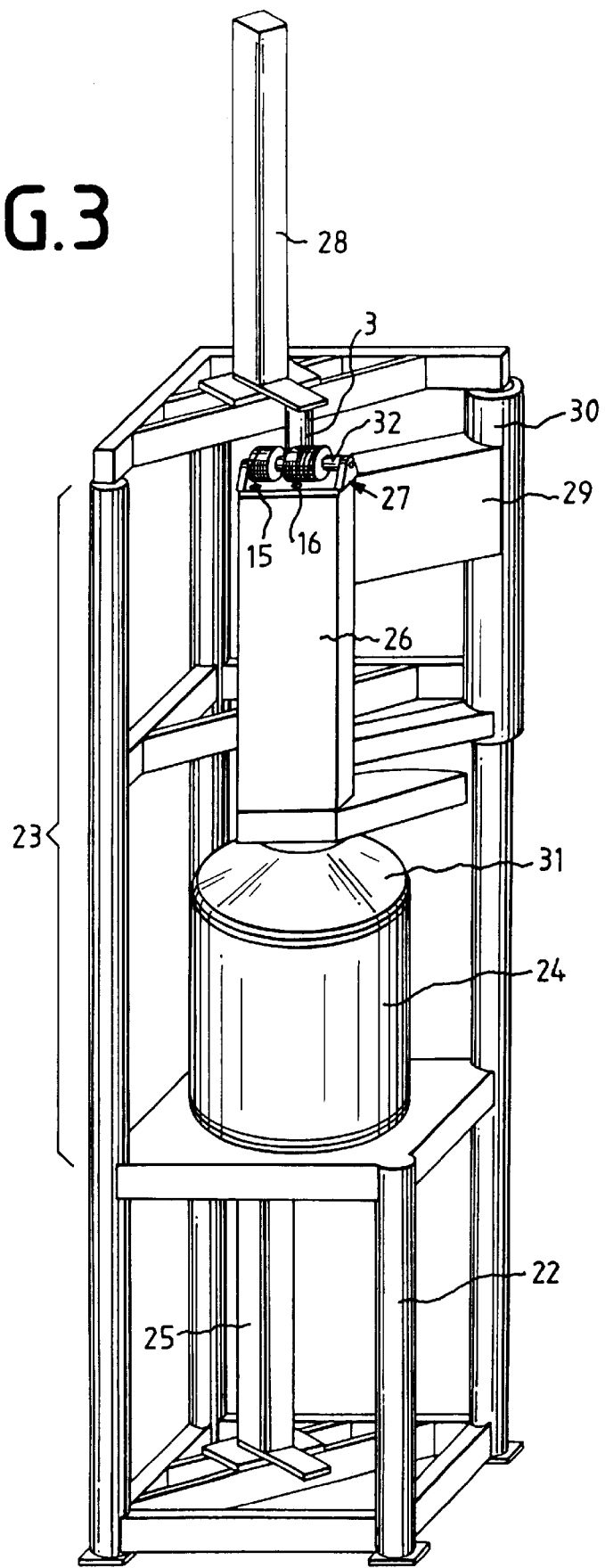
FIG. 3 shows a highly simplified perspective representation of a device for pulling monocrystals.

FIG. 3 shows that the pulling device consists of a main frame 22 with four legs, a top frame 23 with three legs which is situated on top of the main frame, a vacuum chamber 24 with a cover 31 which rests on the main frame, a crucible with a heater situated inside of the vacuum chamber, a crucible supporting bolt 25 that protrudes into the vacuum chamber 24 from the bottom, a lock chamber 26 with a chamber cover 27, a pulling shaft 3 with a driving spindle 28 which protrudes into the lock chamber 26 from the top, and the swivel arm 29 with the drag bearing 30 for displacing the lock chamber 26.

Figure 1:
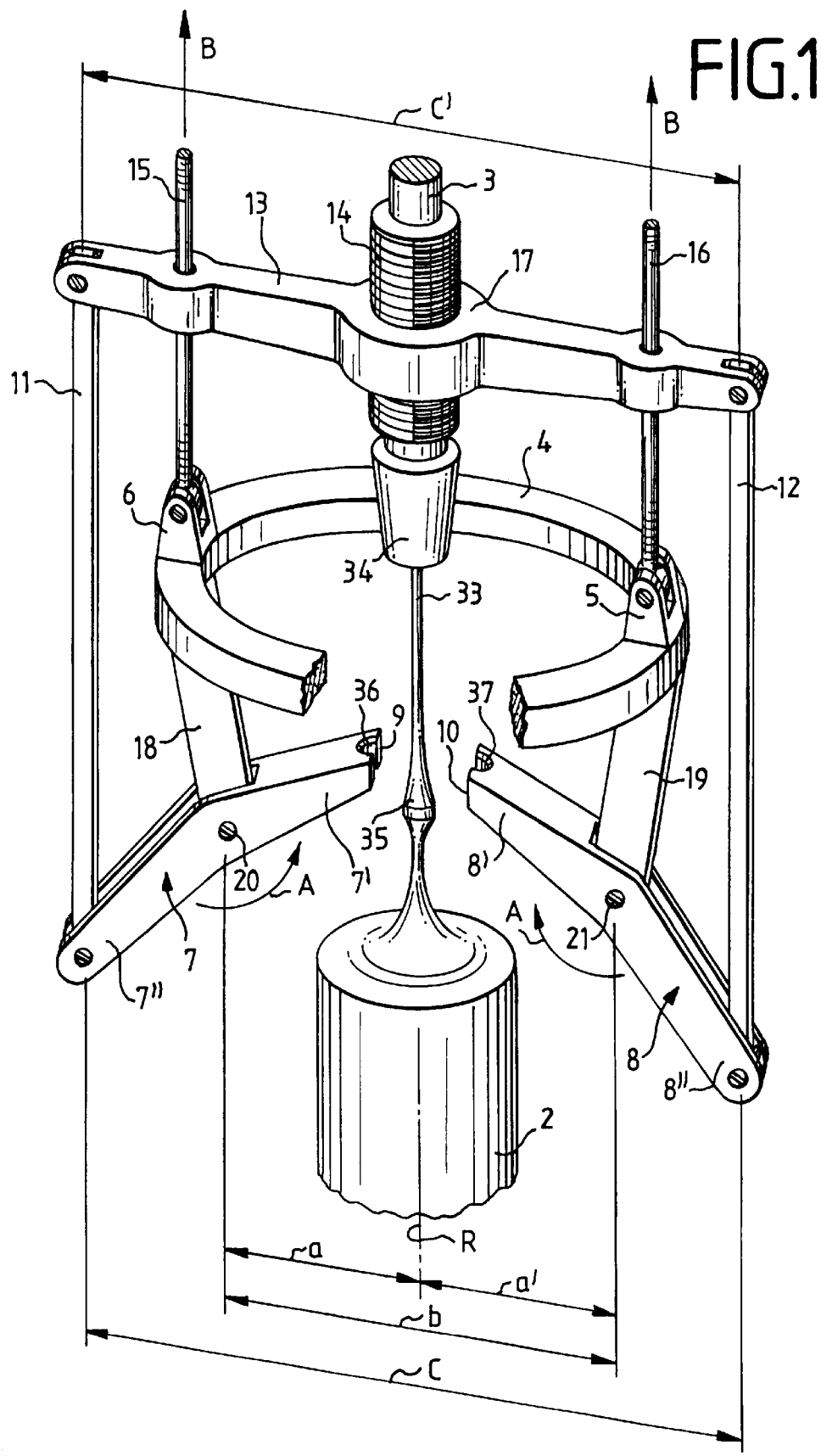
FIG. 1 shows a perspective representation of the lifting unit, wherein both gripping arms are situated in the open position.
Figure 2:
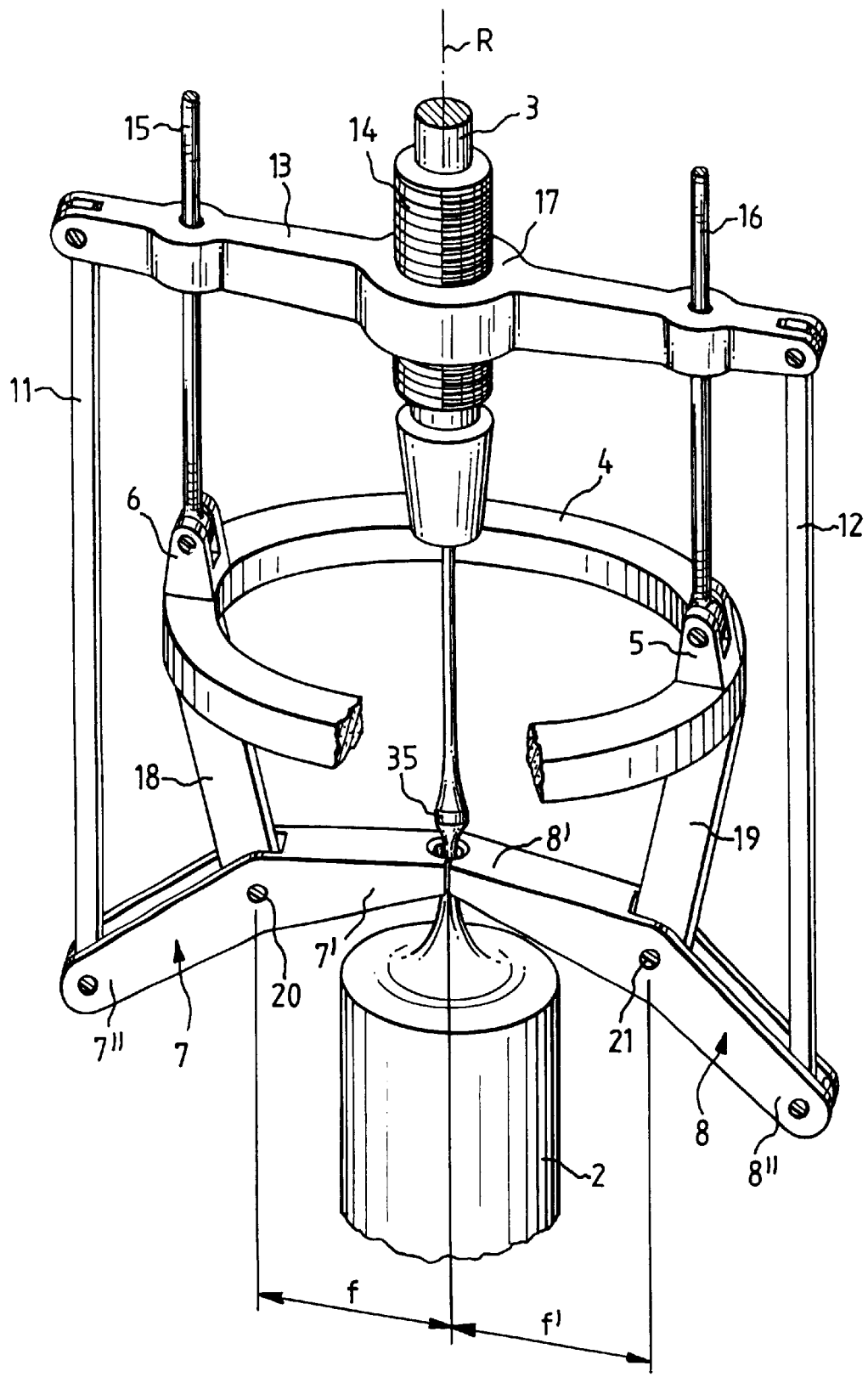
FIG. 2 shows a further perspective view of the lifting unit according to FIG. 1, however, with the gripping arms situated in the closed position.

The high weight of the finished monocrystal 2 that is pulled into the lock chamber 26 from the molten mass is suspended on the very thin seed crystal 33, as shown in FIGS. 1 and 2. In this case, it is possible that the seed crystal fractures if it is subjected to slight vibrations, i.e., the finished crystal 2 would fall into the vacuum chamber 24 such that the crystal is destroyed and the system is rendered unusable for a certain duration. In order to prevent the finished crystal 2 from falling, the device for holding, lifting and guiding the crystal 2 which is illustrated in FIGS. 1 and 2 is arranged in the lock chamber 26. This device essentially consists of the frame 4 that surrounds the seed crystal 33 or the pulling shaft 3 and contains bearings 5, 6 for the cables 15, 16 that extend through openings in the lock chamber cover 27 and can be wound on the pulley lifting tackle 32 that is provided with a motor, the spindle 14 that surrounds the pulling shaft 3 and contains a crossbeam 13 with a spindle nut 17, the two tie rods 11, 12 of identical length which are coupled to the ends of the crossbeam 13, and the tappets 18, 19 that are rigidly connected to the frame 4 and provided with bearings 20, 21 for the two-armed grippers 7, 8, wherein the ends 7", 8" of the grippers which face away from one another are coupled to the tie rods 11, 12. The two-armed grippers 7, 8 are aligned with the rotational axis R.

A thick area 35 is located between the clamping chuck 34 of the pulling shaft 3 for the seed crystal 33 and the crystal 2. If the two grippers 7, 8 are located in the closed position, their gripping arms 7', 8' surround the aforementioned thick area. In this case, the end surfaces 9, 10 of the gripping arms 7', 8' adjoin one another and thus prevent the grippers 7, 8 from also pivoting down, opposite to the direction of the arrow A. The end surfaces 9, 10 of both gripping arms 7', 8' are provided with recesses 36, 37 that are shaped such that both recesses form a conical or funnel-shaped opening that surrounds, secures and holds the thick area 35, i.e., the high weight of the crystal 2 pulled into the lock chamber 26 is transmitted onto the gripping arms 7, 8 via the recesses 36, 37 and from the gripping arms onto the pulling nut or the spindle 14 of the pulling shaft 3 (which is provided with self-locking threads) via the tie rods 11, 12 and the crossbeam 13. The pulling shaft 3 carries the load because the crossbeam 13 is coupled to the pulling shaft via the spindle 14. In this case, it is ensured that the crystal 2 cannot fall down into the vacuum chamber 24 if the seed crystal 33 fractures above the thick area 35 or if said seed crystal is severed at this location in order to remove the finished crystal 2 from the lock chamber 26.

The arms 7', 8' of the grippers 7, 8 have such a length f, f' that the distance of the respective end surface 9 or 10 from the rotational axis of the bearings 20 or 21 is greater than the distance a or a', respectively. In the closed position (FIG. 2), the distance c approximately corresponds to the distance c'. In order to open the gripping arms 7, 8, the cables 15, 16 are pulled upward in the direction of the arrow B with the aid of the pulley lifting tackle 32, wherein the gripping arms 7, 8 are pivoted about the bearing journals 20, 21 that are separated by the distance b in the direction of the arrow A. The entire lifting unit can be vertically adjusted relative to the crystal 2 by turning the spindle 14 relative to the crossbeam 13.

If the gripping arms 7, 8 are located in the closed position illustrated in FIG. 2 and the crystal with its thick area 35 is located in the recesses 36, 37, the cables 15, 16 can be completely alleviated such that they sag without exerting a force.

Further variations and modification will be apparent to those skilled in the art from the foregoing and are intended to be encompassed by the claims appended hereto.

German priority application 197 10 856.3 is relied on and incorporated herein by reference.

We claim:

1. A lifting unit for a device for pulling monocrystals from a molten mass located in a crucible under vacuum or a protective gas atmosphere at reduced pressure, wherein the crucible is arranged in a vacuum chamber that is supported on a main frame and heated by the thermal radiation of a heating element, wherein a pulling shaft for pulling the crystal up from the surface of the molten mass into a lock chamber that can be displaced relative to the main frame, and wherein the lifting unit is held by a housing of a lock chamber, a top frame supported on the main frame or the pulling shaft, with a frame that surrounds the pulling shaft or the crystal and extends in a horizontal plane, wherein said frame is provided with at least two bearings and two-armed grippers that are held in the aforementioned bearings and can be pivoted in vertical planes, wherein each two-armed gripper having one respective gripping arm aligned with the rotational axis of the frame with a length that the end surfaces of the gripping arms which face one another tightly adjoin one another in the closed position and prevent an additional pivoting movement, wherein free ends of the two-armed grippers are coupled to tie rods that approximately extend in the vertical direction, wherein the upper ends of said tie rods are connected in articulated fashion via a horizontally extending crossbeam, wherein the crossbeam with a spindle nut can be adjusted along the pulling shaft via a threaded spindle, and wherein the frame is suspended on cables that can be wound on a pulley lifting tackle held on a cover of the lock chamber or above the lock chamber on the main frame.

2. The lifting unit according to claim 1, wherein:

the spindle nut of the horizontally extending crossbeam is screwed onto the spindle, and the spindle can be turned relative to the pulling shaft and connected to the pulling shaft without rotational play.

3. The lifting unit according to claim 1, wherein the arms of the grippers respectively have a length that is slightly greater than half the distance between the two bearing journals.

4. The lifting unit according to claim 3, wherein:

the spindle nut of the horizontally extending crossbeam is screwed onto the spindle, and the spindle can be turned relative to the pulling shaft and connected to the pulling shaft without rotational play.

5. The lifting unit according to claim 3, wherein the end surfaces that face one another are provided with vertically extending recesses that are wedge-shaped or dome-shaped.

6. The lifting unit according to claim 5, wherein:

the spindle nut of the horizontally extending crossbeam is screwed onto the spindle, and the spindle can be turned relative to the pulling shaft and connected to the pulling shaft without rotational play.

7. The lifting unit according to claim 1, wherein the end surfaces that face one another are provided with vertically extending recesses that are wedge-shaped or dome-shaped.

8. The lifting unit according to claim 7, wherein:

the spindle nut of the horizontally extending crossbeam is screwed onto the spindle, and the spindle can be turned relative to the pulling shaft and connected to the pulling shaft without rotational play.

9. A lifting unit for pulling a monocrystal from a molten mass, comprising:

a frame extending in a horizontal plane and movable in a vertical direction, the frame being positioned such that the frame surrounds at least one of the monocrystal or a pulling shaft provided to pull the monocrystal from the molten mass, the frame including:

two tappets descending from the frame and rigidly connected thereto, and a gripper bearing provided on each tappet, a two-armed gripper pivotably attached to each of the tappets by the gripper bearing, such that the two-armed gripper is pivotable about the gripper bearing in a vertical plane, each two-armed gripper including:

an end arm, and a gripper arm having an end surface such that, when the two-armed grippers are pivoted to bring the gripper arms together toward a rotational axis of the monocrystal to adjoin the end surfaces in a closed position, the end surfaces prevent further movement of the gripper arms toward the rotational axis of the monocrystal, a crossbeam having two ends, and a tie rod provided at each end of the crossbeam, each tie rod being pivotably attached at a lower end of the tie rod to an end arm of a two-armed gripper, and pivotably attached at an upper end of the tie rod to the end of the crossbeam.

10. A lifting unit as recited in claim 9, wherein:

the crossbeam defines a threaded spindle nut at a center portion thereof, and the lifting unit further includes a spindle positionable about a pulling shaft passing, the spindle having threads corresponding to the threads of the spindle nut such that a position of the crossbeam along a pulling shaft can be adjusted.

11. A lifting unit as recited in claim 10, wherein the spindle is shaped such that, when the spindle is positioned about a pulling shaft, the spindle can be turned relative to the pulling shaft and is connected to the pulling shaft without rotational play.

12. A lifting unit as recited in claim 9, wherein the frame further includes at least two cable bearings for attaching the frame to support cables.

13. A lifting unit as recited in claim 12, wherein the crossbeam defines at least two cable holes for passing support cables connected to the cable bearings therethrough.

14. A lifting unit as recited in claim 9, wherein the end faces of the gripping arms define recesses such that, when the two-armed grippers are pivoted to adjoin the end surfaces together in a closed position, the recesses form one of a conical shaped, a funnel shaped and a dome shaped opening.

15. A lifting unit as recited in claim 9, wherein each gripper arm has a length from an end surface to a rotational axis of the gripper bearing to which the gripper arm is connected which is greater than a distance between the rotational axis of the gripper bearing and the axis of rotation of the monocrystal.

16. A lifting unit as recited in claim 15, wherein:
the crossbeam defines a threaded spindle nut at a center portion thereof, and
the lifting unit further includes a spindle positionable about a pulling shaft passing, the spindle having threads corresponding to the threads of the spindle nut such that a position of the crossbeam along a pulling shaft can be adjusted.

17. A lifting unit as recited in claim 16, wherein the spindle is shaped such that, when the spindle is positioned about a pulling shaft, the spindle can be turned relative to the pulling shaft and is connected to the pulling shaft without rotational play.

18. A lifting unit as recited in claim 15, wherein the frame further includes at least two cable bearings for attaching the frame to support cables.

19. A lifting unit as recited in claim 18, wherein the crossbeam defines at least two cable holes for passing support cables connected to the cable bearings therethrough.

20. A lifting unit as recited in claim 15, wherein the end faces of the gripping arms define recesses such that, when the two-armed grippers are pivoted to adjoin the end surfaces together in a closed position, the recesses form one of a conical shaped, a funnel shaped and a dome shaped opening.

* * * * *